United States Patent
Tateyama et al.

(10) Patent No.: US 6,526,329 B2
(45) Date of Patent: Feb. 25, 2003

(54) SUBSTRATE PROCESSING SYSTEM AND SUBSTRATE PROCESSING METHOD

(75) Inventors: Masanori Tateyama, Kikuchi-Gun (JP); Syuzo Fujimaru, Kikuchi-Gun (JP)

(73) Assignee: Tokyo Electron Limited, Tokyo-To (JP)

( * ) Notice: Subject to any disclaimer, the term of this patent is extended or adjusted under 35 U.S.C. 154(b) by 7 days.

(21) Appl. No.: 09/866,717

(22) Filed: May 30, 2001

(65) Prior Publication Data

US 2001/0048865 A1 Dec. 6, 2001

(30) Foreign Application Priority Data

May 31, 2000 (JP) ........................................ 2000-162482

(51) Int. Cl.[7] ................................................. G06F 7/00
(52) U.S. Cl. ........................ 700/213; 700/52; 700/100; 414/940; 414/806
(58) Field of Search ................................. 700/213, 214, 700/218, 28, 52, 100, 102; 414/935, 940, 806; 29/25.01

(56) References Cited

U.S. PATENT DOCUMENTS

| | | | | |
|---|---|---|---|---|
| 5,442,416 A | * | 8/1995 | Tateyama et al. | ............ 396/612 |
| 5,444,632 A | * | 8/1995 | Kline et al. | .................. 700/100 |
| 5,706,200 A | * | 1/1998 | Kumar et al. | ................ 700/100 |
| 5,801,945 A | * | 9/1998 | Comer | ......................... 700/100 |
| 5,838,565 A | * | 11/1998 | Hsieh et al. | ................. 700/100 |
| 5,841,677 A | * | 11/1998 | Yang et al. | .................. 700/100 |
| 5,876,280 A | * | 3/1999 | Kitano et al. | .................. 355/27 |
| 5,993,041 A | * | 11/1999 | Toba | ........................... 700/100 |
| 6,074,443 A | * | 6/2000 | Venkatesh et al. | ......... 29/25.01 |
| 6,122,566 A | * | 9/2000 | Nguyen et al. | .............. 438/908 |
| 6,201,998 B1 | * | 3/2001 | Lin et al. | .................. 204/192.1 |
| 6,224,638 B1 | * | 5/2001 | Jevtic et al. | ................ 29/25.01 |
| 6,317,643 B1 | * | 11/2001 | Dmochowski | .............. 700/100 |

* cited by examiner

Primary Examiner—Khoi H. Tran
(74) Attorney, Agent, or Firm—Oblon, Spivak, McClelland, Maier & Neustadt, P.C.

(57) ABSTRACT

The present invention is a substrate processing method comprising the steps of successively extracting unprocessed wafers from a cassette, successively conveying the extracted wafers to a plurality of processing units, causing the processing units to process the wafers in parallel, and returning the processed wafers to a cassette. A process completion prediction time at which processes for one lot are completed is calculated and displayed corresponding to a process recipe that has been set to a plurality of wafers for at least one lot. Corresponding to the process completion prediction time, a cassette that contains a plurality of unprocessed wafers for one lot is accepted. A cassette that contains a plurality of processed wafers for one lot is returned.

12 Claims, 13 Drawing Sheets

|  | POBAKE | POBAKE |  |  |
|---|---|---|---|---|
|  | POBAKE | POBAKE |  | Cass |
|  | PREBAKE | PREBAKE |  |  |
| NO. 8 EXP Arm | PREBAKE | PREBAKE | CsArm |  |
|  | COL | EXT |  |  |
|  | EXT | ALIM |  | Cass |
|  | COL | AD |  |  |
|  | COL | COL |  |  |
|  | PsArm |  |  | Cass |
| Buffer Buffer | DEV COT | DEV COT |  | Cass |
|  |  |  | Pick Up |  |

| STEP | PROCESSING UNIT |
|---|---|
| S1 | ALIM |
| S2 | AD |
| S3 | COL |
| S4 | COT |
| S5 | PREBAKE |
| S6 | COL |
| S7 | EXP |
| S8 | PEBAKE |
| S9 | COL |
| S10 | DEV |
| S11 | POBAKE |
| S12 | COL |

FIG. 9

SUBSTRATE PROCESSING SYSTEM AND SUBSTRATE PROCESSING METHOD

BACKGROUND OF THE INVENTION

1. Field of the Invention

The present invention relates to a substrate processing system and a substrate processing method for performing a sequence of processes for various types of substrates such as semiconductor wafers and liquid crystal display (LCD) glass substrates.

2. Description of the Related Art

In fabrication processes for LCD substrates and semiconductor devices, fine circuit patterns are formed using a photolithography technology. In the photolithography technology, a resist is coated in a film shape on the front surface of a raw substrate such as an LCD substrate or a semiconductor wafer and then exposed with a predetermined pattern. After the exposed pattern is developed and etched, a desired circuit pattern is obtained.

Recently, as the sizes of semiconductor wafers are becoming large, in the photolithography process, wafers are successively processed. For example, in a complex processing system that performs both of a resist coating process and a developing process, wafers are extracted from a cassette one by one. The extracted wafers are processed in a processing unit one by one. The processed wafers are returned to a cassette. such a complex processing system, one cassette contains for example 25 unprocessed wafers. The wafers are extracted from the cassette one by one. The extracted wafers are successively processed in individual processing units. The processed wafers are returned one by one to an empty cassette. Wafers that are extracted from one cassette and processed in individual processing units are referred to as one lot.

In such a conventional processing system, cassettes are accessed to a processing portion with the stages of four holding tables that hold the cassettes. Assuming that a portion that holds a cassette containing unprocessed wafers and a portion that holds a cassette containing processed wafers are required, one lot uses two stages. Thus, the system has only two stages that hold cassettes containing unprocessed wafers.

Thus, in such a system, to successively process lots, after a first lot has been processed, until a second lot is processed, the operator should change a cassette that contains processed wafers with a cassette that contain unprocessed wafers. However, when the operator repeats such an operation, he or she tends to confuse which cassette contains processed wafers. In addition, the operator cannot know when one lot is processed. Thus, while substrates are being processed, the operator should always watch the operation of the system so that he or she can properly change cassettes. If the operator forgets to change cassettes, the system does not properly operates, thereby remarkably decreasing the throughput of the system.

SUMMARY OF THE INVENTION

An object of the present invention is to provide a substrate processing system and a substrate processing method that allows the throughput of the system to improve.

According to the first aspect of the present invention, the present invention is a substrate processing system that successively extracts unprocessed wafers from a cassette, and successively conveying the extracted wafers to a plurality of processing units to be processed and returning the substrates that completed all the process successively to the cassette. The present invention is comprising of a loading/unloading portion for loading a cassette that contains a plurality of unprocessed substrates corresponding to one lot and unloading a cassette that contains a plurality of processed substrates corresponding to one lot, a processing portion having a plurality of processing units for performing a plurality of processes for substrates, a conveying portion, disposed in the processing portion, for exchanging substrates with the loading/unloading portion and successively conveying the substrates to the processing units, a process procedure setting portion for setting process procedures containing process conditions for individual lots, a calculation processing portion for calculating a process completion prediction time for predicting a process timing for one lot, and an informing portion for informing the operator of the process completion prediction time calculated by the calculation processing portion.

A recipe as a process procedure contains at least information that designates a processing unit. More preferably, such a recipe contains a process procedure such as real process times of individual processing units and process conditions thereof.

In such a manner, the process completion prediction time is calculated and the operator is informed thereof corresponding to the designated recipe. Thus, the operator can change a cassette corresponding to the process completion prediction time.

The informing portion preferably has a displaying portion for displaying a screen for the process completion prediction time. The displaying portion is for example an LCD panel. Since the process completion prediction time is displayed, the operator can properly change a cassette corresponding to information that is displayed.

The calculation processing portion preferably has a storing portion. The calculation processing portion calculates the process completion prediction time corresponding to old process procedures and completion times thereof stored in the storing portion. Thus, the calculation processing portion can properly calculate the process completion prediction time.

The substrate processing system further comprises a temperature and humidity detecting portion for measuring the temperature and humidity in the processing portion, and a controlling portion for adjusting the temperature and humidity in the processing portion corresponding to an output of the temperature and humidity detecting portion and determining whether or not the temperature and humidity are in predetermined ranges. Thus, the system can start real processes in the state that the temperature and humidity are stable in the processing portion. The processing units of the processing portion preferably include a heat processing unit, and a solution processing unit which has the temperature and humidity detecting portion. Thus, since the temperature and humidity of the solution processing units should be accurately managed, after the temperature and humidity thereof become stable, the real processes can be performed.

In addition, the process completion prediction time includes at least one of a first process completion prediction time at which the first unprocessed substrate of one lot is returned to the loading/unloading portion after the substrate is conveyed to a processing unit, a second process completion prediction time at which all unprocessed wafers of one lot are conveyed to a processing unit after the first unprocessed wafer of the lot is conveyed to the processing unit, and a third process completion prediction time at which all processed wafers of one lot are returned from a processing unit to the loading/unloading portion after the first unprocessed wafer of the same lot is conveyed to the processing unit.

The calculation processing portion preferably calculates a cassette changeable time period for which a cassette that contains unprocessed substrates can be changed corresponding to the second process completion prediction time. Thus, since as information that is more detail than the process completion prediction time, a time at which a cassette that contains unprocessed substrates can be obtained. Thus, the operator can more effectively change a cassette that contains unprocessed substrates. Alternatively, the calculation processing portion calculates the cassette changeable time period for which a processed wafer cassette CR can be changed corresponding to the first and third process completion prediction times. Thus, as information that is more detail than the process completion prediction time, a time at which a cassette that contains processed wafers can be obtained. Thus, the operator can more effectively change a cassette that contains processed cassettes.

The calculation processing portion preferably has a storing portion for storing the elapsed time after the cassette changeable time period until the cassette change completion prediction time. Thus, even if the operator forgot to change a cassette, the process completion prediction time and the cassette changeable time can be re-calculated in consideration of the elapsed time of the process completion prediction time.

A second aspect of the present invention is a substrate processing method for successively extracting unprocessed substrates from a cassette, successively conveying the extracted wafers to a plurality of processing units, causing the processing units to process the conveyed substrates, and successively returning the processed substrates to a cassette, the method comprising the steps of calculating a process completion prediction time for predicting a process timing for each lot corresponding to a process procedure including process conditions for at least one lot, informing the operator of the process completion prediction time, accepting a cassette that contains a plurality of unprocessed substrate for one lot corresponding to the informed process completion prediction time, and returning a cassette that contains a plurality of processed substrates for one lot.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 9 is a schematic diagram showing an example of data that is input to the main panel according to the first embodiment of the present invention;

DESCRIPTION OF PREFERRED EMBODIMENTS

Next, with reference to the accompanying drawings, embodiments of the present invention will be described.

(First Embodiment)

Figure 1:
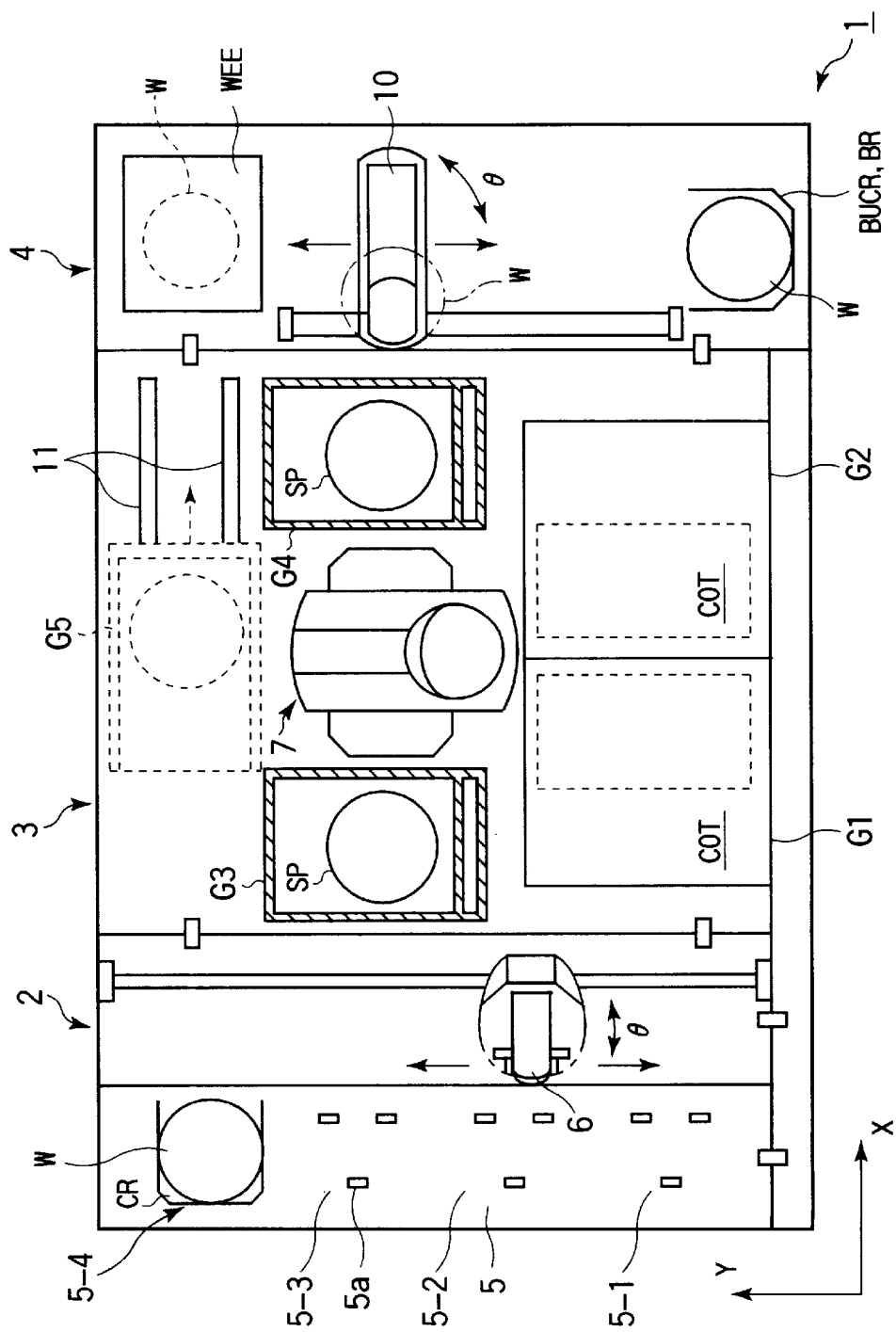
FIG. 1 is a plan view showing the overall structure of a substrate processing system according to a first embodiment of the present invention.
Figure 2:
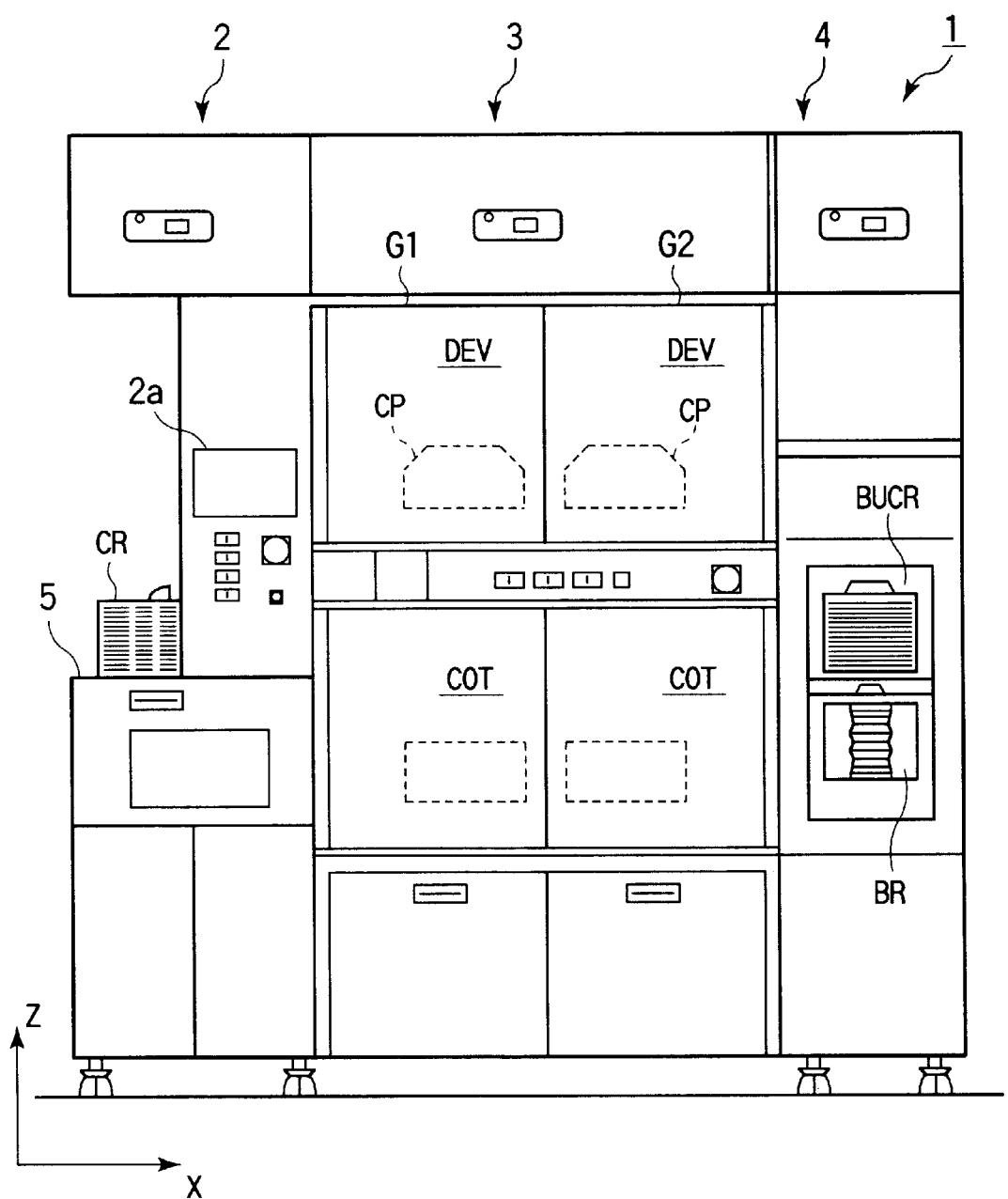
FIG. 2 is a front view showing the structure of the substrate processing system according to the first embodiment of the present invention.
Figure 3:
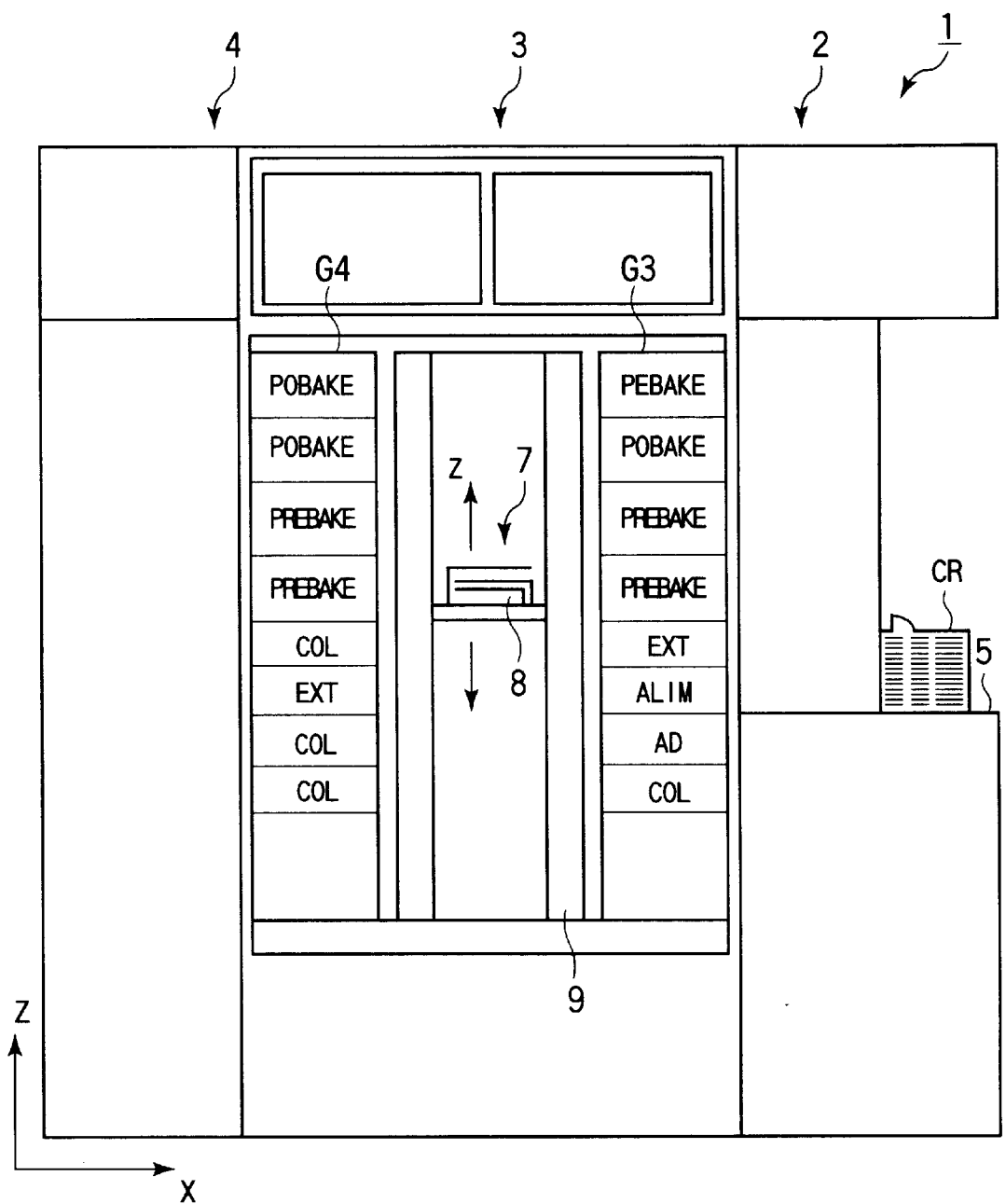
FIG. 3 is a rear view showing the structure of the substrate processing system according to the first embodiment of the present invention.

FIGS. 1 to 3 are schematic diagrams showing the overall structure of a substrate processing system 1 according to the present invention. The substrate processing system 1 comprises a loading/unloading portion 2, a processing portion 3, and an interface portion 4. The loading/unloading portion 2 successively extracts wafers W from a cassette CR. The processing portion 3 performs a resist solution coating process and a developing process for a wafer W extracted from the loading/unloading portion 2. The interface portion 4 transfers the wafer W that has been coated with a resist solution to an exposing device 12. The interface portion 4 has a second sub-arm mechanism 10. The second sub-arm mechanism 10 exchanges the wafer W with the exposing device 12. The loading/unloading portion 2 has a holding table 5 on which a semiconductor wafer W is extracted and returned from/to a cassette CR.

As shown in FIG. 1, in the loading/unloading portion 2, a plurality of (for example, up to four) cassettes CR are disposed at alignment protrusion portions 5a on the holding table 5 so that wafer access openings thereof face the processing portion 3. Referring to FIG. 1, the cassettes CR are arranged in the X direction. A first sub arm mechanism 6 can be moved in the cassette CR arrangement direction (X direction) and the wafer W arrangement direction (z direction: vertical direction) so as to selectively access each cassette CR. The first sub arm mechanism 6 can access four stages 5-1 to 5-4 on the holding table 5.

In addition, the first sub arm mechanism 6 can be rotated in the θ direction so that a wafer W is exchanged with a main arm mechanism 7 disposed in the processing portion 3. In addition, as will be described later, the first sub arm mechanism 6 can access an alignment unit (ALIM) and an extension unit (EXT) of a multi-staged unit portion of a third processing unit group G3 of the processing portion 3.

A wafer W is exchanged between the loading/unloading portion 2 and the processing portion 3 through the third processing unit group G3. As shown in FIG. 3, the third processing unit group G3 is composed of a plurality of processing units that are vertically arranged. The third processing unit group G3 is composed of a cooling unit a cooling unit (COL), an adhesion unit (AD), an alignment unit (ALIM), an extension unit (EXT), two pre-baking units (PREBAKE), a post baking unit (POBAKE), and a post exposure baking unit (PBAKE). The cooling unit (COL) performs a cooling process for a wafer W. The adhesion unit (AD) performs a hydrophobic process for a wafer W so as to improve the fixing characteristic of a resist solution against the wafer W. The alignment unit (ALIM) aligns a wafer W. The extension unit (EXT) causes a wafer W to wait for the next process. Each pre-baking unit (PREBAKE) performs a heating process before an exposing process. The post baking unit (POBAKE) performs a heating process for a wafer W after a developing process. The post exposure baking unit (PEBAKE) performs a heating process for a wafer W after an exposing process.

A wafer W is exchanged with the main arm mechanism 7 through the extension unit (EXT) or the alignment unit (ALIM).

In addition, as shown in FIG. 1, first to fifth processing unit groups G1 to G5 including the third processing unit group G3 are disposed around the main arm mechanism 7. As with the above-described third processing unit group G3, each of the processing unit groups G1, G2, G4, and G5 is composed of various types of processing units that are vertically arranged.

On the other hand, as shown in FIG. 3, the main arm mechanism 7 is composed of a cylindrical guide 9 and a main arm 8. The main arm 8 can be vertically moved along an inner portion of the cylindrical guide 9. The cylindrical guide 9 is connected to the rotating shaft of a motor (not shown). The motor rotates the main arm 8 around the rotating shaft. Thus, the main arm 8 can be rotated in the θ direction. Alternatively, the cylindrical guide 9 may be connected to another rotating shaft (not shown) rotated by another motor (not shown). As was described above, by vertically moving the main arm 8, it can access each processing unit of the processing unit groups G1 to G5 so as to load/unload a wafer W thereto/therefrom.

As shown in FIG. 3, the fourth processing unit group G4 is composed of two cooling units (COL), an extension unit (EXT), a cooling unit (COL), two pre-baking units (PREBAKE), and two post baking units (POBAKE) that are vertically arranged in succession from the bottom to the top.

The fifth processing unit group G5 is optionally disposed. In the example, the structure of the fifth processing unit group G5 is the same as the structure of the fourth processing unit group G4. The fifth processing unit group G5 is movably held along a rail 11 so that the main arm mechanism 7 and the first to fourth processing units G1 to G4 can be easily maintained.

When the present invention is applied to the substrate processing system shown in FIGS. 1 to 3, since individual processing units are vertically arranged, the installation space of the units can be remarkably reduced.

Figure 4:
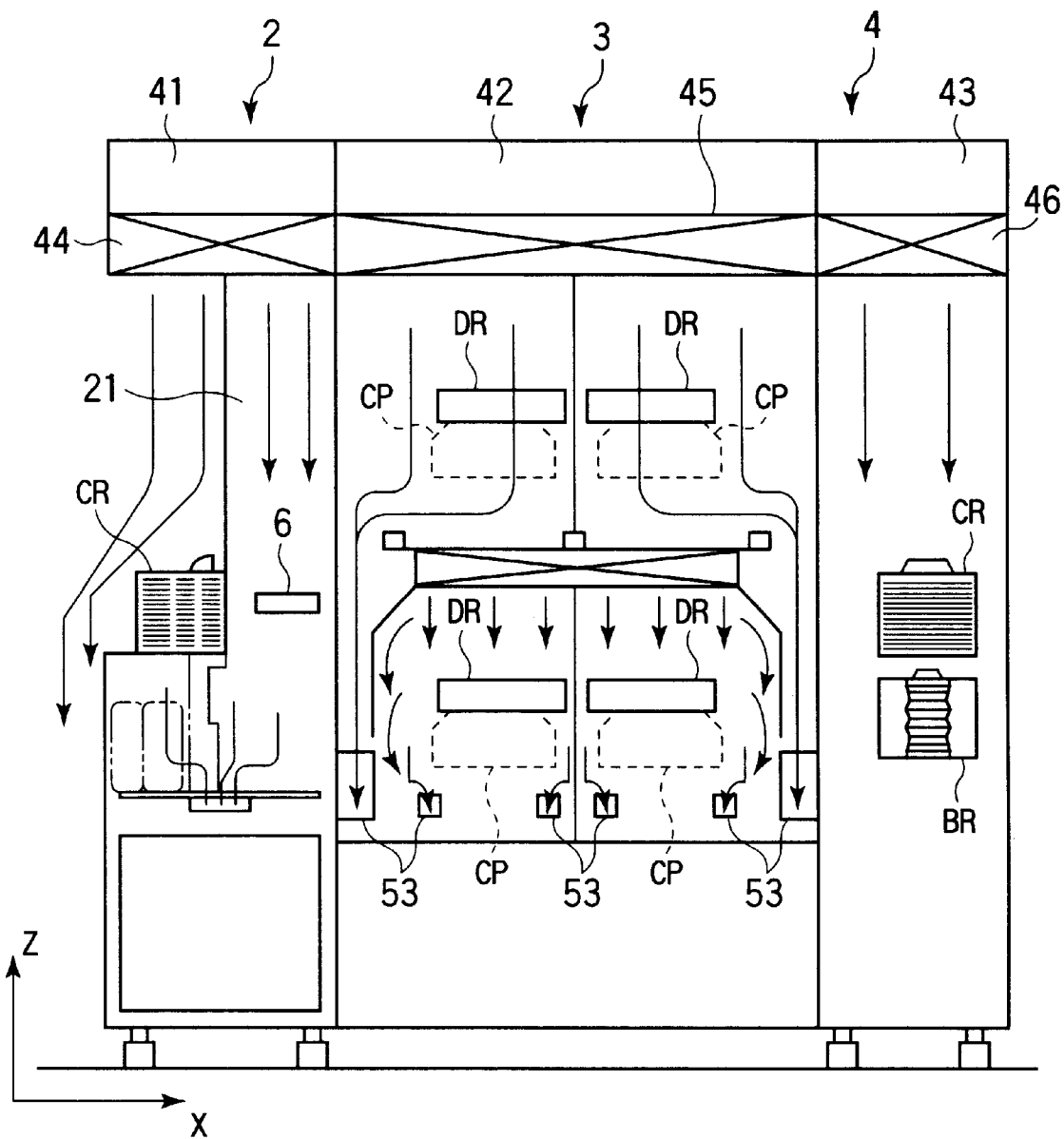
FIG. 4 is an exploded view showing a flow of clean air in the substrate processing system according to the first embodiment of the present invention.

The substrate processing system 1 is disposed in a clean room in which clean air flows downwards. Next, with reference to FIGS. 4 and 5, the flow of clean air in the substrate processing system 1 will be described. As shown in FIG. 4, clean air flows downwards in the substrate processing system 1. Thus, the cleanness of each unit of the substrate processing system 1 is improved. The system 1 has air supply chambers 41, 42, and 43 disposed above the loading/unloading portion 2, the processing portion 3, and the interface portion 4, respectively. ULPA filters 44, 45, and 46 are disposed below the air supply chambers 41, 42, and 43, respectively. Each of the ULPA filters 44, 45, and 46 has a dust protecting function.

Figure 5:
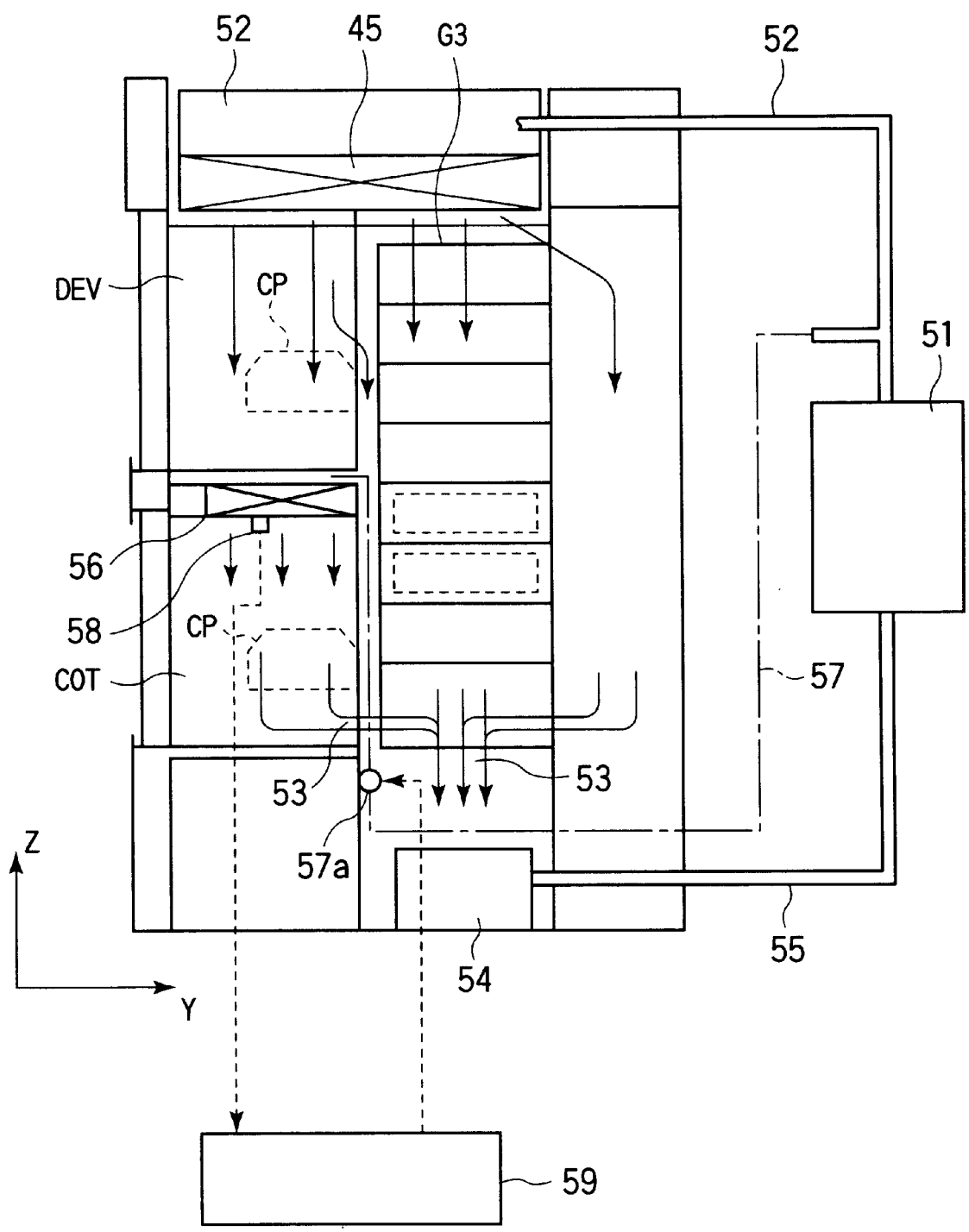
FIG. 5 is an exploded view showing a flow of clean air in the substrate processing system according to the first embodiment of the present invention.

In addition, as shown in FIG. 5, an air conditioner 51 is disposed outside or in the rear of the substrate processing system 1. The air conditioner 51 supplies air to the air supplying chambers 41, 42, and 43 through a pipe 52. Clean air purified by the ULPA filters 44, 45, and 46 of the individual air supplying chambers is supplied as down flow air to the individual portions 2, 3, and 4, respectively. The down flow air is gathered to an exhaust opening 54 at the bottom of the system through air holes 53 formed at many positions of the system. The air gathered to the exhaust opening 54 is collected by the air conditioner 51 through a pipe 55.

In the processing portion 3, ULPA filters 56 are disposed on the ceilings of resist coating units (COT) disposed in lower stages of the multi-staged units of the first and second processing unit groups G1 and G2. Air is supplied from the air conditioner 51 to the ULPA filters 56 through a pipe 57 branched from the pipe 52. A temperature/humidity adjusting device 57a is disposed in the middle of the pipe 57. Clean air at predetermined temperature and humidity suitable for the resist coating process is supplied to the resist coating units (COT). A humidity/temperature sensor 58 is disposed on the air blow side of each of the ULPA filters 56. An output signal of the sensor is sent to a controller 59 of the temperature/humidity adjusting device 57a so that the temperature and humidity of the clean air can be accurately controlled on feedback basis.

Referring to FIG. 4, openings DR are formed on side walls of the spinner type processing units (COT) and (DEV) facing the main arm mechanism 7 so that a wafer W and a conveying arm are accessed. Each of the openings DR has a shutter (not shown) that prevents particles and so forth from entering from each unit to the main arm mechanism 7.

The air conditioner 51 controls the amount of air that is supplied to and exhausted from a conveying chamber 21 so that the inner pressure of the conveying chamber 21 is higher than the inner pressure of the clean room. Thus, air does not flow from the inside of the clean room and a cassette CR to the conveying chamber 21. As a result, particles do not enter the conveying chamber 21. In addition, the inner pressure of the processing portion 3 is higher than the inner pressure of the conveying chamber 21. Thus, air does not flow from the conveying chamber 21 to the processing portion 3. As a result, particles do not enter the processing portion 3.

Figure 6:
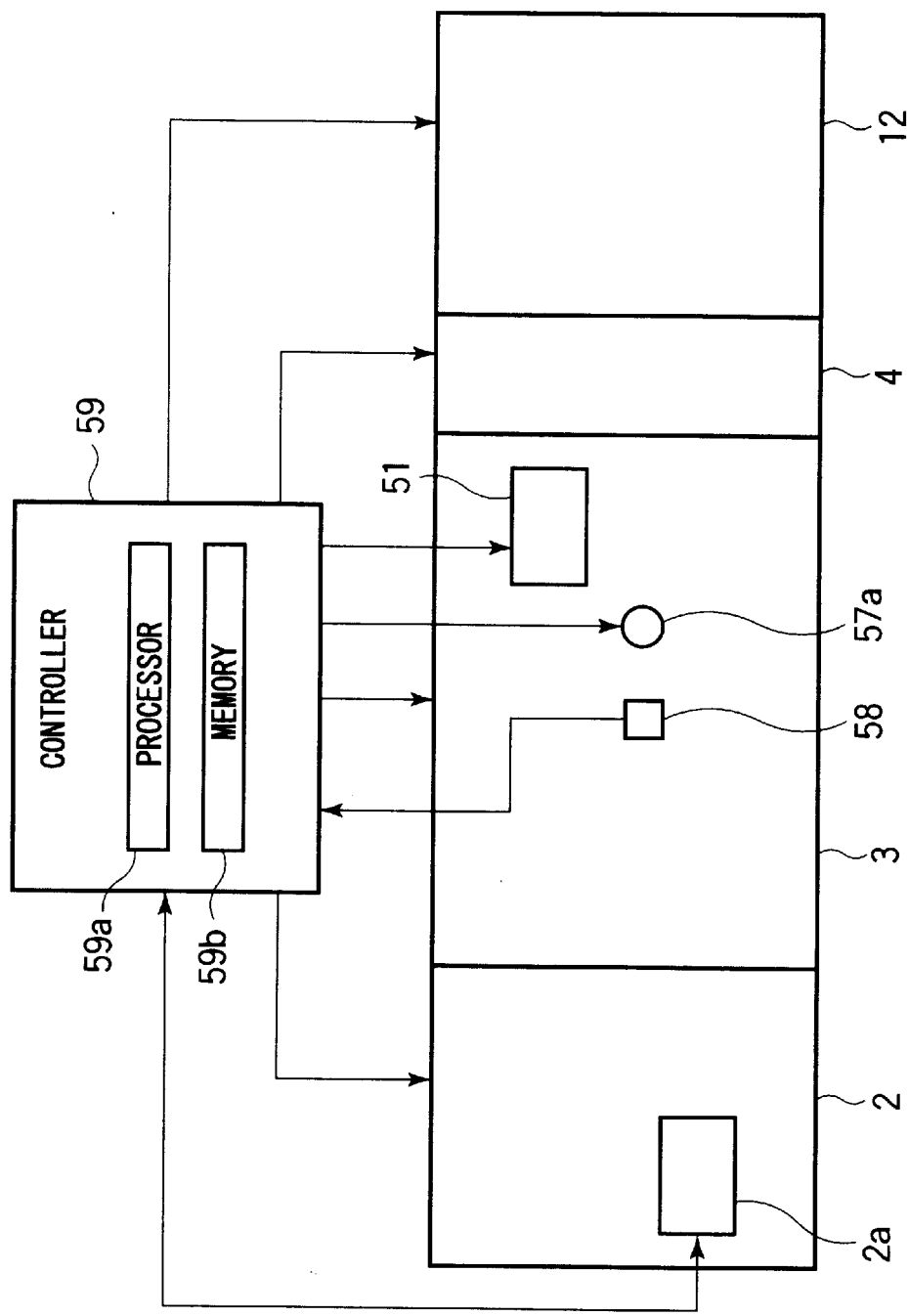
FIG. 6 is a schematic diagram showing a control of the substrate processing system according to the first embodiment of the present invention.

FIG. 6 is a block diagram showing a control of the substrate processing system 1. A main panel 2a is disposed on the front wall of the loading/unloading portion 2. The main panel 2a is used to control and operate the entire system such as a recipe setting operation, a wafer flow registering operation, and an alarm generating operation. The main panel 2a is of touch sensor type. When the operator operates the substrate processing system 1, he or she touches an input portion on the screen of the main panel 2a with a touch pen.

The main panel 2a is connected to the controller 59. Data of a recipe that is input on the main panel 2a is output to the controller 59. The controller 59 sends control commands for individual portions corresponding to data of a recipe and so forth to the loading/unloading portion 2, the processing portion 3, the interface portion 4, and the exposing device 12 so as to control them. Referring to FIG. 5, the controller 59 is disposed outside the substrate processing system 1. In reality, the controller 59 is disposed in the loading/unloading portion 2.

A processor 59a and a memory 59b are disposed in the controller 59. The processor 59a calculates for example a process completion prediction time and a cassette changeable time. In addition, the processor 59a performs various calculation processes such as temperature and humidity controls of the processing portion 3.

In this example, the process completion prediction time is a concept that includes a first process completion prediction time, a second process completion prediction time, and a third process completion prediction time. The first process completion prediction time is a prediction time after the first wafer W of one lot is conveyed to the processing portion 3 until the first wafer W is returned to the loading/unloading portion 2. The second process completion prediction time is a prediction time after the first wafer W of one lot is conveyed to the processing portion 3 until the last wafer W of the same lot is conveyed to the processing portion 3. The third process completion prediction time is a completion prediction time after the first wafer W of one lot is conveyed from the loading/unloading portion 2 to the processing portion 3 until the last wafer W of the same lot is returned to the loading/unloading portion 2. These process completion prediction times are calculated to inform the operator of a cassette CR change time. Thus, the operator can know at what time he or she can change an objective cassette CR.

More reality, the first process completion prediction time is a time at which a processed wafer cassette CR for a wafer W that has been processed in the processing portion 3 should be placed. The second process completion prediction time is a time at which all wafers W of an objective lot are conveyed to the processing portion 3 and the cassette CR that has contained the unprocessed wafers W can be removed because the first sub arm mechanism 6 does not extract an unprocessed wafer W from the cassette CR. The third process completion prediction time is a time at which all wafers W of an objective lot are returned to a processed wafer cassette CR and the first sub arm mechanism 6 does not access the processed wafer cassette CR. Wafers W that are successively extracted from one cassette CR are referred to as one lot.

The process completion prediction times are calculated corresponding to process completion prediction functions stored in the memory 59b. Alternatively, recipes of past processes and process completion prediction time data thereof may be stored in the memory 59b instead of the process completion prediction functions. The process completion prediction times may be calculated by the processor 59a corresponding to the past data. In this case, if past data does not contain a recipe to be processed, the process completion prediction times can be calculated using one or more similar recipes.

In the case that a plurality of wafers W are processed in individual processing units in parallel, that when one process cycle is obtained in a regular state of which one processing unit is affected by another processing unit, and that a process time in a transient state of which one processing unit is not affected by another processing unit, the process completion prediction times can be calculated with information of a process recipe.

In addition, the processor 59a calculates the cassette changeable time corresponding to the first to third process completion prediction times. Next, with reference to flow charts shown in FIGS. 11 and 12, the method for calculating the cassette changeable time will be described. In the example, it is assumed that a wafer W extracted from a cassette CR on the stage 5-1 is returned to a cassette CR on the stage 5-4 and that a wafer W extracted from a cassette CR on the stage 5-2 is returned to a cassette CR on the stage 5-3. The first lot is supplied from the stage 5-1. The second lot is supplied from the stage 5-2. The third lot is supplied from the stage 5-1. The fourth lot is supplied from the stage 5-2.

Figure 11:
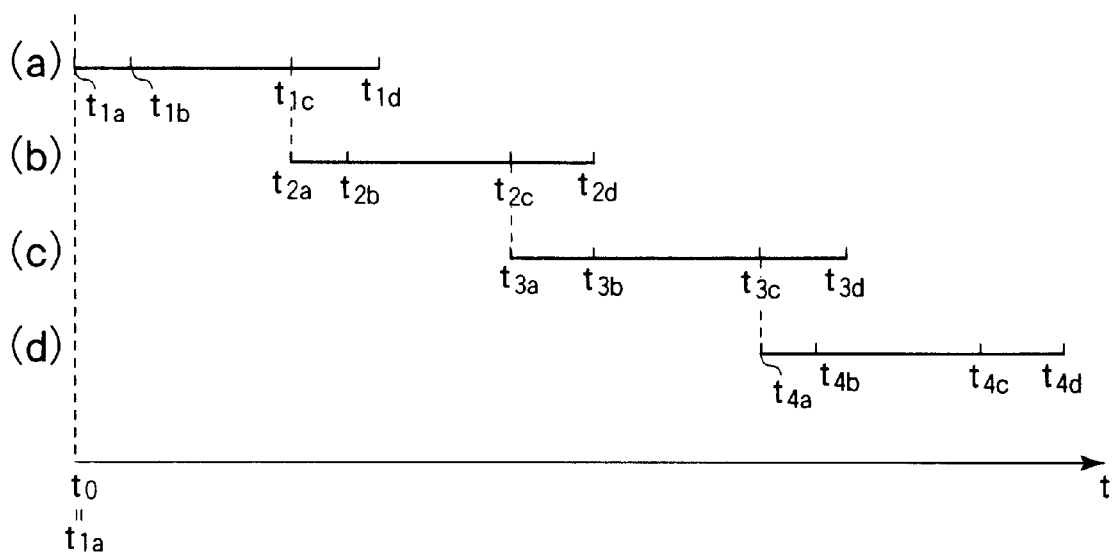
FIG. 11 is a timing chart showing real processes for individual lots by the substrate processing system according to the first embodiment of the present invention.

FIG. 11 is a timing chart showing an example of real processes for the first lot to the fourth lot. In FIG. 11, (a) to (d) show required time periods (t1a to t1d, t2a to t2d, t3a to t3d, and t4a to t4d) of the first to fourth lots, respectively. A required time period is a time period after the first wafer W of one lot is extracted from a cassette CR and conveyed to the processing portion 3 until all wafers of the same lot are returned to a cassette CR. In the following description, a numeral as a postscript of a time t represents a lot number.

An alphabetic character as a postscript of a time t represents a process state. In FIG. 11, t1a, t2a, t3a, and t4a represent times at which wafers W of individual lots are conveyed to the processing portion 3. In FIG. 11, t1b, t2b, t3b, and t4b represent times at which the first wafers W of the individual lots that have been processed in the processing portion 3 are returned to the respective cassettes CR. In FIG. 11, t1c, t2c, t3c, and t4c represent times at which all wafers W of the individual lots are conveyed to the processing portion 3. In FIG. 11, t1d, t2d, t3d, and t4d represent times at which all wafers W of the individual lots are returned from the processing portion 3 to the individual cassettes CR. In FIG. 11, the first process completion prediction time is denoted by tb. The second process completion prediction time is denoted by tc. The third process completion prediction time is denoted by td.

As shown in the timing chart, the four cassettes are handled so that the relations of $t1c=t2a$, $t2c=t3a$, and $t3c=t4a$ are satisfied. Corresponding to the relations, at the time of which the first wafer W of the first lot is processed, the absolute process completion prediction times of all the lots can be calculated starting from teh successive lot process start time. In other words, the following relations are satisfied. (Absolute process completion prediction time of second lot)=(second process completion prediction time of first lot)+(second process completion prediction time of second lot); (absolute process completion prediction time of third lot)=(second process completion prediction time of first lot)+(second process completion prediction time of second lot)+(second process completion prediction time of third lot); and (absolute process completion prediction time of fourth lot)=(second process completion prediction time of first lot)+(second process completion prediction time of second lot)+(second process completion prediction time of third lot)+(second process completion prediction time of fourth lot).

Thus, it is clear that the absolute process completion prediction time of the k-th lot is expressed as $tk\alpha = t1c + t2c + \ldots + t(k-1)c + tkd$. Thus, the first process completion prediction time of the k-th lot is expressed as $tk\alpha(1) = t1c + t2c + \ldots + tkb$. The second process completion prediction time of the k-th lot is expressed as $tk\alpha(2) = t1c + t2c + \ldots + tkc$. The third process completion prediction time of the k-th lot is expressed as $tk\alpha(3) = t1c + t2c + \ldots + tkd$.

Figure 12:
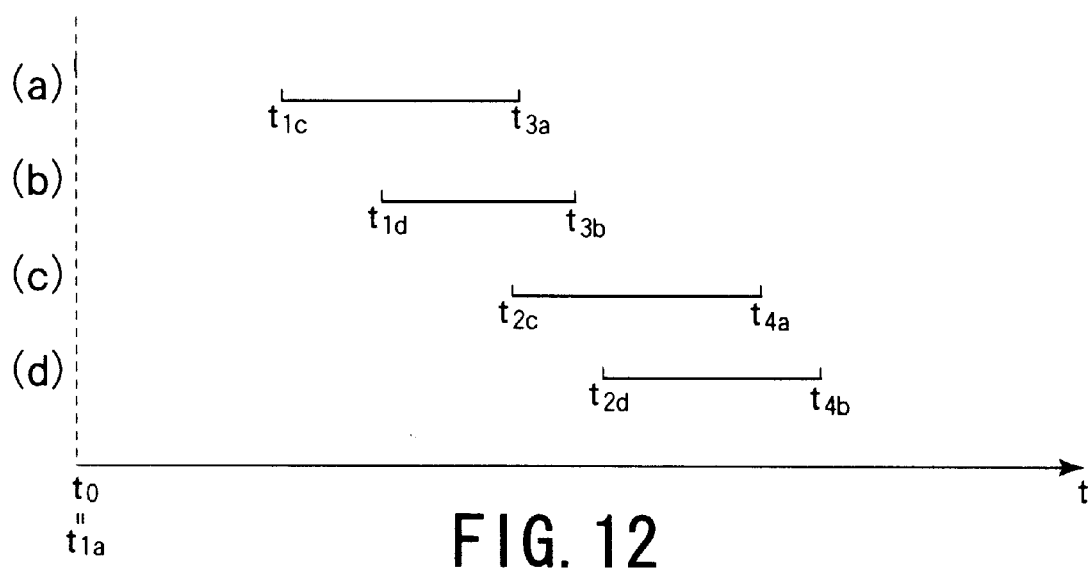
FIG. 12 is a timing chart showing cassette changeable times of individual stages in timings shown in FIG. 10.

FIG. 12 shows cassette changeable times corresponding to the timing chart shown in FIG. 11. In FIG. 12, (a)

represents an unprocessed wafer cassette CR changeable time period for the first lot; (b) represents a processed wafer cassette CR changeable time period for the first lot; (c) represents an unprocessed wafer cassette CR changeable time period for the second lot; and (d) represents a processed wafer cassette CR changeable time period for the second lot. Thus, (a) represents the cassette CR changeable time period for the stage 5-1; (b) represents the cassette CR changeable time period for the stage 5-4; (c) represents the cassette CR changeable time period for the stage 5-2; and (d) represents the cassette CR changeable time period for the stage 5-3.

As shown in (a) of FIG. 12, a cassette CR on the stage 5-1 can be changed in the timing of times t1c to t3a. As shown in (b) of FIG. 12, a cassette CR on the stage 5-4 can be changed in the timing of times t1d to t3b. As shown in (c) of FIG. 12, a cassette CR on the stage 5-2 can be changed in the timing of times t2c to t4a. As shown in (d) of FIG. 12, a cassette CR on the stage 5-3 can be changed in the timing of times t2d to t4b.

When expressed in the absolute times starting from the success lot processes, cassettes CR on the stages 5-1, 5-4, 5-2, and 5-3 can be changed in the timings of times $t1\alpha(2)$ to $t2\alpha(2)$, times $t1\alpha(3)$ to $t2\alpha(1)$, times $t2\alpha(2)$ to $t3\alpha(2)$, and times $t2\alpha(3)$ to $t3\alpha(1)$, respectively.

Thus, the unprocessed wafer cassette changeable time period for the s-th lot is expressed as $ts(start)=ts\alpha(2)$ to $t(s+1)\alpha(2)$. The processed wafer cassette changeable time period for the s-th lot is expressed as $ts(end)=ts\alpha(3)$ to $t(s+1)\alpha(1)$.

Thus, it is clear that the cassette changeable time periods can be expressed with the absolute times starting from the beginning of the successive lot processes. Consequently, in such timings of cassette changeable time periods, an alarm is generated by a cassette changeable alarm device (not shown) or displayed on the main panel 2a through the controller 59. Alternatively, two or three minutes prior to the process completion prediction time periods, an alarm may be generated by the alarm device or displayed on the main panel 2a. Thus, cassettes can be changed in more proper timings.

Figures 7A, 7B:
FIGS. 7A and 7B are schematic diagrams showing examples of screens displayed on a main panel of the substrate processing system according to the first embodiment of the present invention.

FIG. 7A shows an example of a screen displayed on the main panel 2a corresponding to a recipe that has been set. Processes performed in individual processing units are displayed at the center of the screen. The processes displayed on the screen are roughly divided into three blocks. The right block displays processes performed in the loading/unloading portion 2. The center block displays processes performed in the processing portion 3. The left block displays processes performed in the exposing device 12.

FIG. 7B shows an example of a screen displayed corresponding to a lot that is selected. On the screen, the leftmost column displays cassettes CR that are currently placed on stages of the stages of the holding table 5. The right column of the cassette indication portion displays stages for start cassettes CR (namely, unprocessed wafer cassettes). The right column of the start cassette portion displays stages for end cassettes CR (namely, processed wafer cassettes).

The right column of the cassette CR indication portion and stage indication portions is a process completion prediction time indication portion. The process completion prediction time portion displays the first to third process completion prediction times of the lot that is currently supplied to the processing portion 3.

The upper column of the process completion prediction time portion is a start button. When the operator touches the start button, the system 1 starts the substrate processes.

When the temperature/humidity adjustments of the system 1 have been completed, a process recipe has been set, or a process completion prediction time and a cassette changeable time have been calculated, the start button blinks in blue so that the operator can know that the system 1 can start the real processes.

The upper column of the start button is a cassette CR changeable time period indication portion. The indication portion corresponds to the stages 5-1 to 5-4. When a cassette can be changed on the stage 5-1, the stage 5-1 state indication portion at the right column of the screen shown in FIG. 7B blinks in red. The indication portion also displays how many minutes the cassette can be changed in the count-down format. The operator can remove the processed wafer cassette CR from the holding table 5 and place an unprocessed wafer cassette CR thereon corresponding to the cassette changeable time period and the process completion prediction time displayed on the main panel 2a.

The screens shown in FIGS. 7A and 7B can be switched by touching "SCREEN SELECTION" at the upper right positions of the screens.

The substrate processes performed by the processing system will be described with reference to a flow chart shown in FIG. 8.

First of all, the temperature and humidity in the substrate processing system 1 are raised (at step S81). In reality, a main power button (not shown) disposed on the front wall of the loading/unloading portion 2 is pressed so as to turn on the entire power of the substrate processing system 1. Thus, air starts blowing to the inside of the substrate processing system 1. As a result, the temperature and humidity in the substrate processing system 1 are adjusted.

Thereafter, a conveying recipe, a process recipe, and so forth are set on the main panel 2a (at step S82). The conveying recipe describes the contents of processes (such as an adhesion process, a developing process, and an exposing process) and the order of the processes. A recipe is set with a touch pen on the main panel 2a of the loading/unloading portion 2.

In reality, for example, steps and processing units as shown in FIG. 9 are designated. When a plurality of processing units are disposed for one process, it is not necessary to designate real processing units. Detail process conditions (for example, temperature and process time) for each processing unit may be pre-stored as data in the controller 59. Alternatively, when steps and processing units are designated, detail process conditions may be designated.

In addition, when a recipe is set, the number of wafers W to be processed can be designated. Alternatively, when a cassette CR is placed on the holding table 5, the number of wafers W can be automatically detected by a sensor.

When the indication of each processing unit is touched on the main panel 2a, the current screen is switched to a screen for the corresponding process unit so that a detail process recipe (for example, temperature, real process time period, and number of rotations of a stage) can be set.

When a recipe and so forth are input in such a manner, a flow of the recipe and so forth are displayed on the main panel 2a. FIG. 9 shows an example of a screen displayed on the main panel 2a corresponding to a recipe that is set. As shown in FIG. 9, process numbers are displayed in the ascending order of processes. A detail process recipe of the corresponding processing unit is displayed by touching a position corresponding to the processing unit. With reference to the screen displayed on the main panel 2a, the operator determines whether or not the recipe that has been set is correct.

The operator places a cassette CR containing a predetermined number of wafers on the holding table 5 (at step S83). The loading/unloading portion 2 detects the number of wafers W contained in the cassette CR with a sensor (not shown) and outputs a detection signal to the controller 59. In addition, the operator designates an unprocessed wafer cassette (start cassette) CR and a processed wafer cassette (end cassette) CR on the screen shown in FIG. 7B (at step S84). The cassette CR designation information is output from the main panel 2a to the controller 59. When a plurality of lots are successively processed, start and end cassettes of all the lots can be designated. When the holding table 5-1 has been assigned to a start cassette CR for the first lot and the holding table 5-4 has been assigned to an end cassette CR for the first lot, a start cassette CR for the next lot is assigned to the holding table 5-2 and an end cassette CR for the next lot is assigned to the holding table 5-3. In addition, a start cassette CR for the next lot is assigned to the holding table 5-1 and an end cassette CR for the next lot is assigned to the holding table 5-4. In such a manner, all the lots are assigned.

When a recipe for processes has been correctly set on the main panel 2a, the operator touches an arrow indication portion of the lower right column on the screen shown in FIG. 9. Thus, the controller 59 determines that the recipe has been correctly set. The controller 59 calculates the process completion prediction time corresponding to the recipe, the cassette CR assignment information, and the number of wafers W contained in the cassette CR. The calculated process completion prediction time is displayed on the process start screen shown in FIG. 7B of the main panel 2a (at step S85).

Thereafter, the operator checks that the temperature/humidity adjustments have been completed in the substrate processing system 1 on the screen shown in FIG. 7B (at step S86). The operator inputs a process start command on the main panel 2a (at step S87). In reality, the operator inputs the process start command by touching "start" on the screen shown in FIG. 7B. Thus, a process start signal is output to the controller 59. The controller 59 causes the individual processing units to start their processes corresponding to the process start signal.

Figure 10:
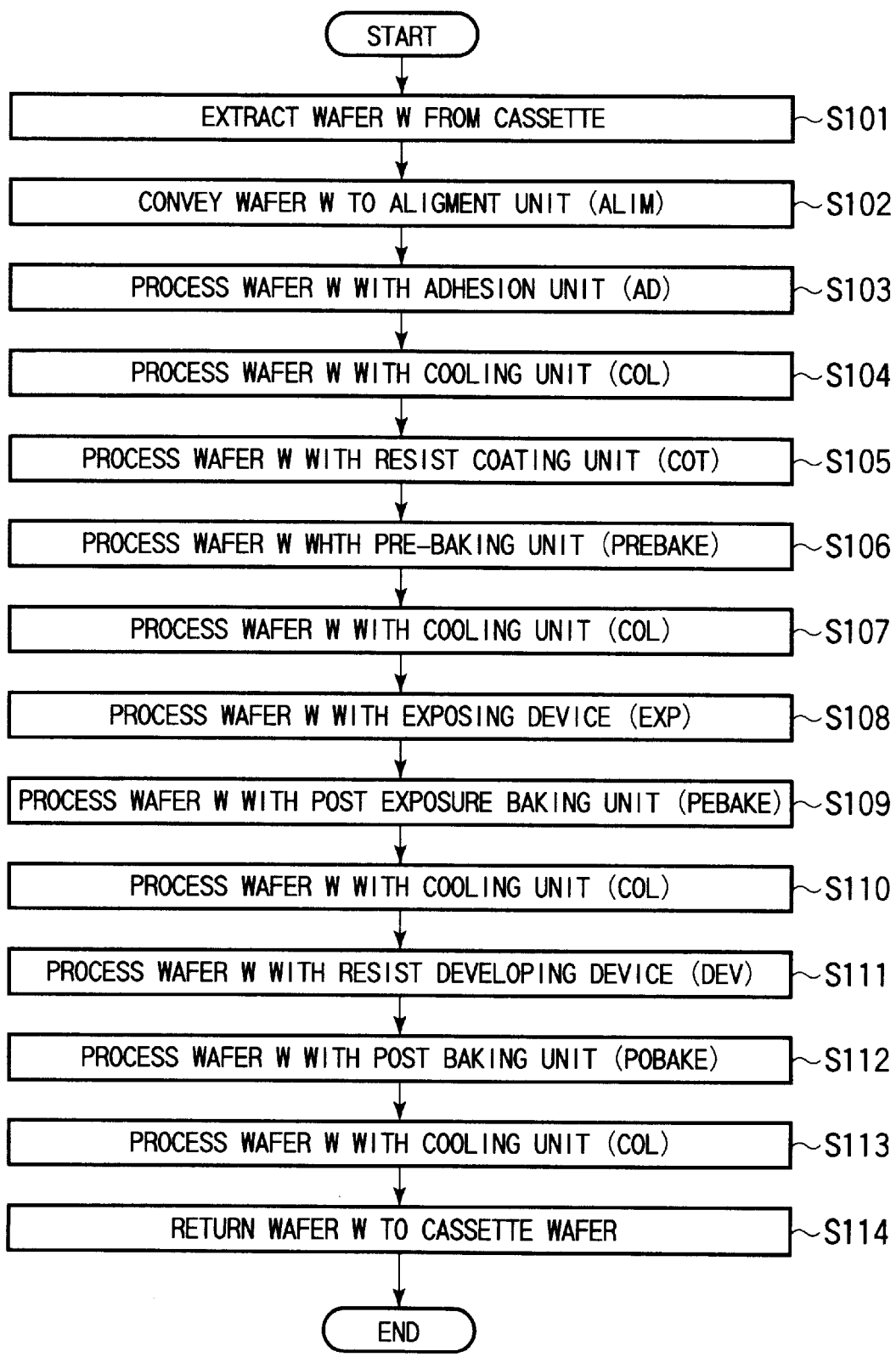
FIG. 10 is a flow chart showing real processes for a wafer W in the substrate processing system according to the first embodiment of the present invention.

FIG. 10 shows an example of a flow chart showing real processes of individual processing units. While real processes for the first lot are being performed, the operator can always check the process completion prediction time of the lot on the screen shown in FIG. 7B of the main panel 2a. Alternatively, the flow of the processes of the individual processing units for the next lot may be different from the flow shown in FIG. 10.

Wafers W contained in a cassette CR placed on the holding table 5 of the loading/unloading portion 2 are extracted one by one by the first sub arm mechanism 6 and conveyed to the loading/unloading portion 2 one by one (at step S101). A conveyed wafer W is moved in the X direction and conveyed to the processing portion 3. The wafer W is conveyed to the alignment unit (ALIM) of the third processing unit group G3 (at step S102). After the wafer W is aligned by the alignment unit (ALIM), the wafer W is conveyed to the adhesion unit (AD) by the main arm mechanism 7. The required time period after the wafer W is conveyed to the alignment unit (ALIM) until it is conveyed to the adhesion unit (AD) is denoted by t1. FIG. 10 is a timing chart showing processes for the substrate W in the transient state.

The adhesion unit (AD) performs a hydrophobic process for the wafer W (at step S103). The time period for which the hydrophobic process of the adhesion unit (AD) is performed is denoted by t2. Thereafter, the wafer W is conveyed from the adhesion unit (AD) to the cooling unit (COL). The cooling unit (COL) performs a cooling process for the wafer W (at step S105). The required time period for which the cooling process is performed is denoted by t3. The cooling unit (COL) is composed of four units COL1 to COL4. The cooling process for the wafer W can be performed by any of the units COL1 to COL4. Likewise, when a plurality of processing units are disposed for the same process in the transient state, in any case, the process can be performed by any unit. Thereafter, the wafer W is aligned and conveyed to the resist solution coating unit (COT1) (or COT2) of the first processing unit group G1 (or second processing unit group G2). At a predetermined process time t4, the resist coating unit (COT1) rotationally coats the resist to the wafer W (at step S105).

The resist-coated wafer W is inserted into the pre-baking unit (PREBAKE) so as to evaporate solvent (thinner) from the resist solution and dry the wafer W (at step S106). The required time period for which the pre-baking process is performed for the wafer W is denoted by t5.

The wafer W conveyed from the pre-baking unit (PREBAKE) is cooled by the cooling unit (COL) in a predetermined time period t6 (at step S107). Thereafter, the wafer W is transferred to the second sub arm mechanism 9 disposed in the interface portion 4 through the extension unit (EXT).

When the second sub arm mechanism 9 receives a wafer W from the interface portion 4, the second sub arm mechanism 9 inserts the wafer W into a buffer cassette BUCR. The interface portion 4 transfers the wafer W to an exposing device 12 (not shown). After the exposing device 12 has performed an exposing process for the wafer W (at step S108), the interface portion 4 receives the wafer W from the exposing device 12. The wafer W is transferred to a peripheral exposing device (WEE). The peripheral exposing device (WEE) exposes an unnecessary resist on the periphery of the wafer W. The resultant wafer W is transferred to the main arm mechanism 7 in the reverse operation. The main arm mechanism 7 inserts the exposed wafer W into a post exposure baking unit (PEBAKE). The required time period after the wafer W is conveyed from the cooling unit (COL) until the exposed wafer W is conveyed to the post exposure baking unit (PEBAKE) is denoted by t7.

The post exposure baking unit (PEBAKE) performs a heating process for the wafer W in a predetermined time period t8 (at step S109). Thereafter, the wafer W is conveyed to the cooling unit (COL). Thereafter, the cooling unit (COL) performs a cooling process for the wafer W at a predetermined temperature in a predetermined time period t9 (at step S110).

The wafer W that has been cooled is inserted into a resist developing device (DEV) of the first processing unit group G1 (or second processing unit group G2). The resist developing device (DEV) develops the wafer W in a predetermined time period t10 (at step S111). The developed wafer W is conveyed to the post baking unit (POBAKE). The post baking unit (POBAKE) performs a heating and drying process for the wafer W (at step S112). The main arm mechanism 7 conveys the wafer W to the cooling unit (COL4). The cooling unit (COL4) performs a cooling process for the wafer W in a predetermined time period t12 (at step S112). Thereafter, the main arm mechanism 7 conveys the wafer W to the loading/unloading portion 2 through the extension unit (EXT) of the third processing unit group G3 and then inserts the wafer W into the cassette CR (at step S114).

In such a transient state, when wafers W are successively extracted from a cassette CR and then processed, since the first wafer W that has been extracted from the cassette CR is being processed, the processes for the next wafer W may be affected by the first wafer W. When the processes for the next wafer W are affected by the first wafer W, the substrate processing system 1 starts controlling the maximum process time. In reality, each processing unit has a sensor (not shown) that determines whether or not the unit is performing a predetermined process. Each sensor is connected to the controller 59. Corresponding to the detection signals of the sensors, the controller 59 determines whether or not a wafer W is affected by processes for another wafer W. When the wafer W is affected by processes for another wafer W, the processes for substrates W in the transient state are completed. As a result, the processes for substrates W in the regular state are started.

In the regular state, a plurality of wafers W are supplied to the processing portion 3. In addition, the processes of adjacent units are affected by each other. In the regular state, the process of each unit is performed in a predetermined time period T as one cycle.

While real processes are being performed at those steps, the operator can check the time at which all wafers W of one lot are extracted from a cassette CR with reference to the process completion prediction time displayed on the main panel 2a. When the second process completion prediction time becomes zero, all wafers W of the first lot have been extracted from a cassette CR and transferred to the processing portion 3. When a plurality of lots are successively processed, the first wafer W of the second lot is extracted from a cassette CR. In other words, the real processes for the second lot are started (at step S90). When the real processes for the second lot are started, the process completion prediction time of the second lot is counted down. As with the process completion prediction time of the first lot, the process completion prediction time of the second lot is displayed on the screen shown in FIG. 7B on the main panel 2a (at step S91). After the cassettes CR are repeatedly changed (at step S93), the real processes for all the cassettes CR are completed (at step S92).

In reality, the operator changes cassettes CR corresponding to the cassette changeable time periods and the process completion prediction times displayed on the screen shown in FIG. 7B of the main panel 2a in the timings shown in FIG. 12.

Thus, according to the first embodiment of the present invention, the processor 59a of the controller 59 calculates a process completion prediction time corresponding to a recipe that the operator has set. The operator can check the process completion prediction time on the screen. Thus, the operator can properly change a cassette corresponding to the process completion prediction time. In addition, with the temperature/humidity adjusting device 57a, the operator can know the stable state of the temperature and humidity by the change in color of the start button, therefore, he or she can start the successive processing of the lots after the temperature and humidity of the solution processing unit inside the system 1 become stable. Thus, wafers W can be stably processed.

In addition, the processor 59a calculates the cassette changeable time periods corresponding to the first to third process completion prediction times and displays the calculated results on the main panel 2a. Thus, the operator can change cassettes corresponding to the time periods displayed on the main panel 2a. As a result, the operator can more safely change cassettes than the case that only the process completion prediction times are displayed. In addition, the operator does not need to always watch cassettes in the system.

(Second Embodiment)

Next, a modification of the first embodiment will be described as a second embodiment of the present invention. According to the second embodiment, when the operator could not change a cassette CR in a cassette changeable time period, it is compensated.

As was described in the first embodiment, the cassette changeable time period has been obtained when real processes for one of a plurality of lots are started. However, when the operator could not mistakenly change a cassette CR in the cassette changeable time period, it deviates from the real process start time for the first lot. In other words, since a cassette CR has not been changed, the continuous processes are not started. However, since the cassette changeable time period elapses, the operator may be informed of an incorrect cassette changeable time period.

To solve such a problem, according to the second embodiment of the present invention, the controller 59 cumulates time lags corresponding to sensor outputs after the sensors (not shown) detect that cassettes CR for individual lots that are successively processed have not been changed. Thereafter, the controller 59 adds the cumulated time lags to the cassette changeable time periods that have been calculated in the successive lot processes.

Next, with reference to timing charts shown in FIGS. 13 and 14, a more real cassette changing operation in the successive lot processes will be described.

Figure 13:
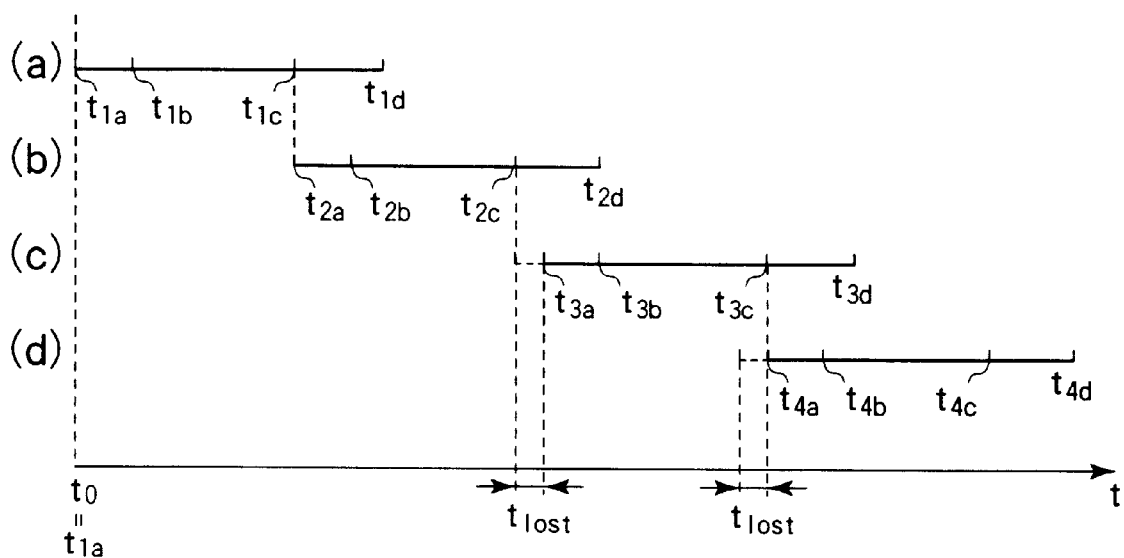
FIG. 13 is a timing chart showing real processes for individual lots of a substrate processing system according to a second embodiment of the present invention.
Figure 14:
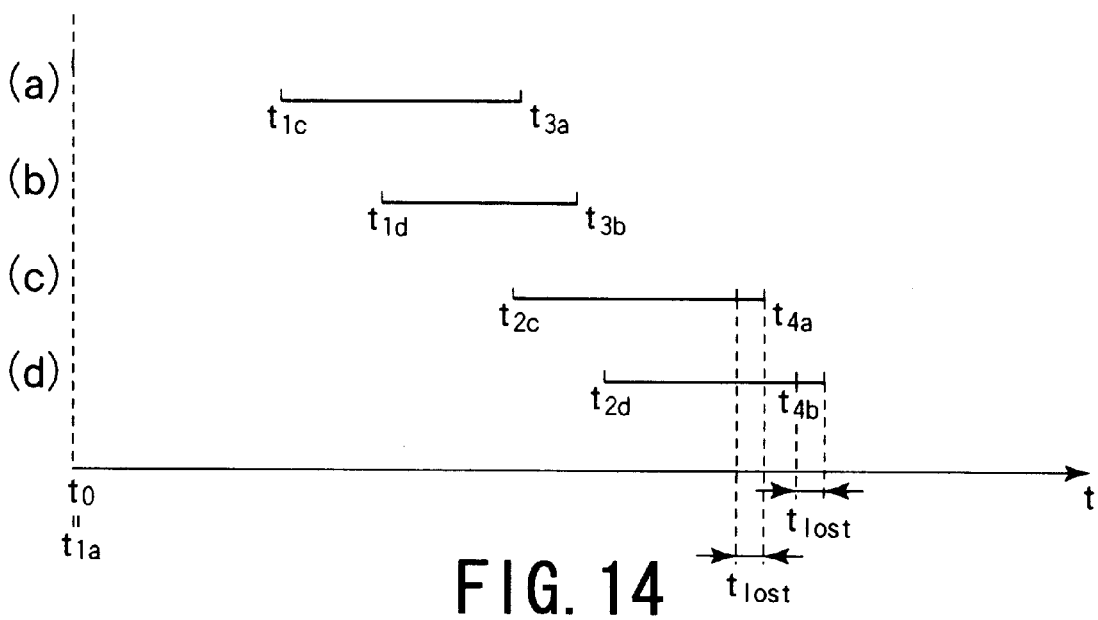
FIG. 14 is a timing chart showing cassette changeable times of individual stages in timings shown in FIG. 13.

FIG. 13 is a timing chart showing real processes for first to fourth lots. In FIG. 13, (a) to (d) show required time periods for the first to fourth lots (t1a to t1d, t2a to t2d, t3a to t3d, and t4a to t4d), respectively. FIG. 14 is a timing chart showing cassette changeable time periods corresponding to the timing chart shown in FIG. 13.

Now, it is assumed that the first lot has been processed before the third lot is processed. In addition, it is assumed that after the cassette changeable time period for an unprocessed substrate cassette (start cassette) CR has elapsed by a time t-lost without changing the cassette CR, the cassette CR is changed. In that case, the real processes for the third lot start with a delay of the time t-lost. In other words, the time period after the cassette changeable time period starts until the cassette has been changed is expressed as t-lost. In such a situation, according to the first embodiment, the cassette changeable time period is displayed without consideration of the time lag t-lost. However, according to the second embodiment, the controller 59 adds the time lag t-lost to the cassette changeable time period corresponding to the sensor output (not shown). Thus, the controller 59 stops displaying the cassette changeable time period and the process completion prediction time on the main panel 2a until the time lag t-lost elapses.

After the time t-lost has elapsed, the count-down indications of the cassette changeable time period and the process completion prediction time are resumed on the main panel 2a. Thus, as shown in (c) and (d) of FIG. 14, the cassette changeable time periods are displayed with a delay of the time lag t-lost against the calculated values. Since the cassette changeable time periods and the process completion prediction times are delayed corresponding to the time lags of the operator's operations, cassette changing operations can be resumed in accurate and proper timings.

Not only in the case that the operator could not change a cassette CR in a proper cassette changeable time period, but in the case that the processing system stops due to an error, the cassette changeable time period and the process completion prediction time can be delayed by the time period for which the system has stopped. In addition, when a dummy process is performed or conditions of individual units are changed in the processing system, the cassette changeable time periods and the process completion prediction times for individual slots may be delayed.

Figure 15:
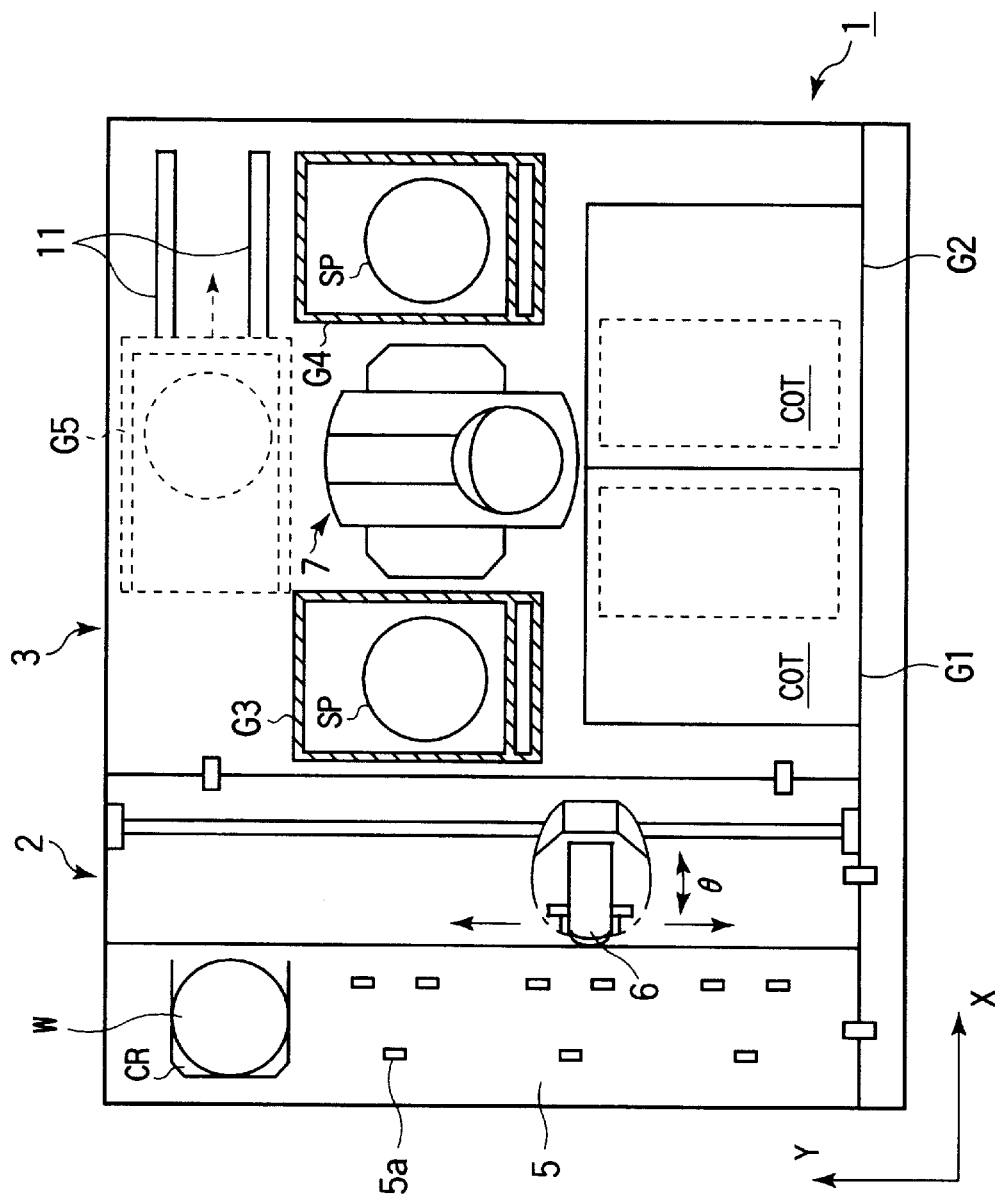
FIG. 15 is a plan view showing the overall structure of a modification of a substrate processing system according to the present invention.

It should be noted that the present invention is not limited to the above-mentioned embodiments. In other words, the present invention can be applied to units other than the above-described substrate processing units. For example, the units of each processing unit group may be used for other processes. In addition, the number of units of each processing unit group can be changed. Moreover, according to the above-described embodiments, the present invention can be applied to a substrate processing system for a photolithography process. However, the present invention can be also applied to a processing system shown in FIG. 15. The processing system shown in FIG. 15 is composed of a loading/unloading portion 2 and a processing portion 3 without an interface portion 4 and an exposing device 12.

In addition, in the substrate processing systems according to the above-described embodiments, a plurality of cooling units (COL) are disposed for the same cooling process. One of the cooling units is selected. However, the present invention is not limited to such an example. In other words, the present invention can be applied to a system having one unit for each process.

Figure 8:
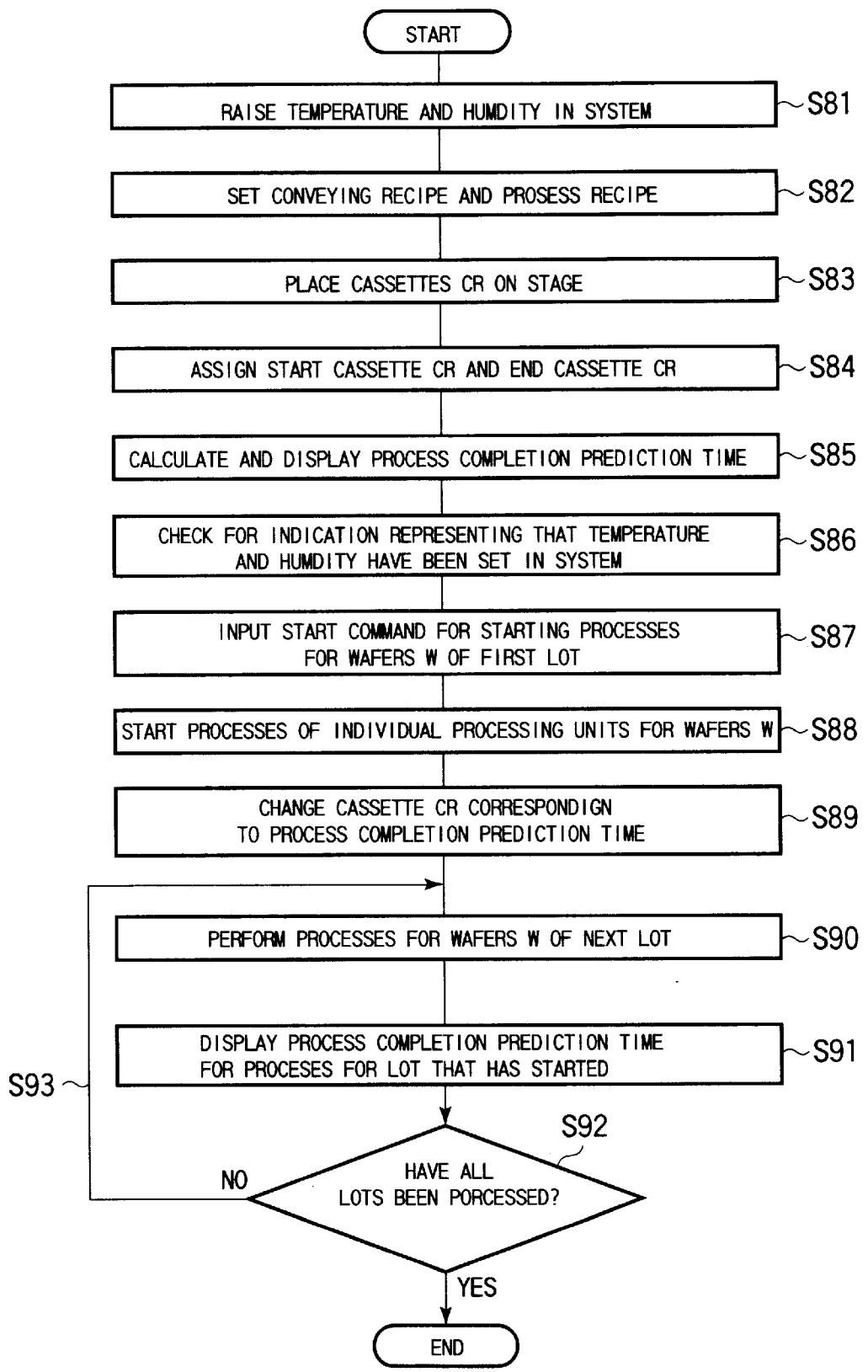
FIG. 8 is a flow chart showing substrate processes according to the first embodiment of the present invention.

In addition, at step S86 shown in FIG. 8, the operator checks that the temperature and temperature have been set in the system and inputs a start command for the real processes for wafers. However, it should be noted that the present invention is not limited to such a structure. Alternatively, when the controller 59 determines that the temperature and humidity have been set in the substrate processing system 1, the controller 59 may automatically start the real processes for wafers W without need to wait for an input of an operator's command.

In the above-described embodiments, the case that four stages 5-1 to 5-4 on the holding table 5 are fully operated was described. However, the present invention is not limited to such a structure. For example, the present invention can be applied to the case that for example one stage gets defective. In addition, according to the present invention, the number of stages on which cassettes CR are placed is not limited to four. Alternatively, the number of stages may be three or less or five or more.

In addition, according to the above-described embodiments, the first to third process completion prediction times and the cassette changeable time periods are displayed. Corresponding to these times and periods, the operator changes cassettes. However, the present invention can be not limited to such a structure. For example, only corresponding to the second process completion prediction time, the operator can change an unprocessed wafer cassette (start cassette). For example, only corresponding to the first and third process completion prediction times, the operator can change a processed wafer cassette (end cassette). In addition, when a cassette changeable time period is displayed, the operator can change a cassette without need to know the process completion prediction time. When the process completion prediction time that is counted down becomes a predetermined time or less (for example, five minutes, three minutes, or one minute prior to the completion prediction time), an alarm may be generated.

When the operator sets a recipe for each lot, it is not necessary to include all process conditions in the recipe. For example, a recipe for each lot may be addressed and stored to the memory 59b. When the operator inputs a desired address, a recipe corresponding thereto is automatically set.

In the above-described embodiments, the operator performs the cassette changing operation. Of course, when an AGV changes a cassette, the AGV may move to the processing system in an optimum timing corresponding to the relevant process completion prediction time so as to change the cassette in the optimum timing.

As was described above, according to the present invention, since the operator is informed of the process completion prediction times, he or she can change cassettes corresponding to the informed process completion prediction times.

The disclosure of Japanese Patent Application No. 2000-162482 filed May 31, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing system, comprising:
   a loading/unloading portion configured to load a cassette that contains a plurality of unprocessed substrates corresponding to one lot and to unload a cassette that contains a plurality of processed substrates corresponding to said one lot;
   a processing portion having a plurality of processing units configured to perform a plurality of processes for substrates;
   a conveying portion, disposed in said processing portion, configured to exchange substrates with said loading/unloading portion and successively convey the substrates to the plurality of processing units;
   a process procedure setting portion configured to set process procedures including process conditions for individual lots;
   a calculation processing portion configured to calculate a process completion prediction time for predicting a process timing for said one lot; and
   an informing portion configured to inform an operator of the process completion prediction time calculated by said calculation processing portion,
   wherein the process completion prediction time is a first process completion prediction time at which a first processed substrate of said one lot is returned to said loading/unloading portion after a first unprocessed substrate is conveyed to the processing portion.

2. The substrate processing system as set forth in claim 1, wherein the process completion prediction time is a second process completion prediction time at which all unprocessed substrates of said one lot are conveyed to the processing portion after the first unprocessed substrate of the lot is conveyed to the processing portion.

3. The substrate processing system as set forth in claim 1, wherein the process completion prediction time is a third process completion prediction time at which all processed substrates of said one lot are returned from the processing portion to said loading/unloading portion after the first unprocessed substrate of the same lot is conveyed to the processing portion.

4. The substrate processing system as set forth in claim 2, wherein said calculation processing portion calculates a cassette changeable time period for which a cassette that contains unprocessed substrates can be changed corresponding to the second process completion prediction time.

5. The substrate processing system as set forth in claim 1, wherein the process completion prediction time includes a first process completion prediction time at which the first processed substrate of said one lot is returned to said loading/unloading portion after the first unprocessed substrate is conveyed to the processing portion and a third process completion prediction time at which all processed substrates of said one lot are returned from the processing portion to said loading/unloading portion after the first unprocessed substrate of the same lot is conveyed to the processing portion, and wherein said calculation processing portion calculates a cassette changeable time period for which a cassette that contains processed substrates can be changed corresponding to the first process completion prediction time and the third process completion prediction time.

6. The substrate processing system as set forth in claim 4, wherein said informing portion further informs the operator of the cassette changeable time period.

7. The substrate processing system as set forth in claim 1, wherein said calculation processing portion has a storing portion configured to store an elapsed time between an end of a cassette changeable time period and the cassette change completion prediction time.

8. The substrate processing system as set forth in claim 5, wherein said calculation processing portion calculates the cassette changeable time period and the process completion prediction time so that the cassette changeable time period and the process completion prediction time are delayed when the cassette could not be changed in the cassette changeable time period.

9. The substrate processing system as set forth in claim 5, wherein when the substrate processing system has stopped due to an error, said calculation processing portion calculates the cassette changeable time period and the process completion prediction time so that the cassette changeable time period and the process completion prediction time are delayed by a time period equal to a time for which the substrate processing system has stopped.

10. A substrate processing method, for successively extracting unprocessed substrates from a cassette, successively conveying the extracted substrates to a plurality of processing units, causing the processing units to process the conveyed substrates, and successively returning the processed substrates to a cassette, the method comprising:

calculating a process completion prediction time for predicting a process timing for each lot corresponding to a process procedure including process conditions for at least one lot;

informing an operator of the process completion prediction time;

accepting a cassette that contains a plurality of unprocessed substrates for one lot corresponding to the informed process completion prediction time; and returning a cassette that contains a plurality of processed substrates for said one lot, wherein the process completion prediction time is a first process completion prediction time at which the first processed substrate of said one lot is returned to a loading/unloading portion after the first unprocessed substrate is conveyed to the plurality of processing units.

11. The substrate processing method as set forth in claim 10, wherein the process completion prediction time is a second process completion prediction time at which all unprocessed substrates of said one lot are conveyed to the plurality of processing units after the first unprocessed substrate of the lot is conveyed to the plurality of processing units.

12. The substrate processing method as set forth in claim 10, wherein the process completion prediction time is a third process completion prediction time at which all processed substrates of said one lot are returned from the plurality of processing units to a loading/unloading portion after the first unprocessed substrate of the same lot is conveyed to the plurality of processing units.

* * * * *